United States Patent [19]

Welmers

[11] Patent Number: 4,620,288
[45] Date of Patent: Oct. 28, 1986

[54] DATA HANDLING SYSTEM FOR A PATTERN GENERATOR

[75] Inventor: Thomas E. Welmers, Reseda, Calif.

[73] Assignee: American Semiconductor Equipment Technologies, Woodland Hills, Calif.

[21] Appl. No.: 545,650

[22] Filed: Oct. 26, 1983

[51] Int. Cl.[4] .......................................... G06K 15/00
[52] U.S. Cl. .................................. 364/518; 364/520; 382/1; 340/720; 340/750
[58] Field of Search .................. 382/1; 364/518–523; 340/750, 727, 730, 731, 720; 101/93, 104

[56] References Cited

U.S. PATENT DOCUMENTS

| | | | |
|---|---|---|---|
| 3,816,726 | 6/1974 | Sutherland et al. | 364/518 |
| 3,925,776 | 12/1975 | Swallow | 340/717 |
| 3,944,997 | 3/1976 | Swallow | 340/717 |
| 4,020,462 | 4/1977 | Morrin, II | 340/728 |
| 4,119,956 | 10/1978 | Murray | 340/728 |
| 4,254,467 | 3/1981 | Davis et al. | 364/521 |
| 4,318,097 | 3/1982 | Oura | 340/728 |
| 4,353,061 | 10/1982 | Beck | 340/720 |
| 4,367,533 | 1/1983 | Wiener | 364/519 |
| 4,442,503 | 4/1984 | Schütt et al. | 340/747 X |
| 4,454,507 | 6/1984 | Srinivasan | 340/747 X |
| 4,479,119 | 10/1984 | Sakano | 340/791 |
| 4,529,978 | 7/1985 | Rupp | 340/727 |

OTHER PUBLICATIONS

Sutherland et al., "Reentrant Polygon Clipping", [Communications of the ACM, Jan. 1974], Tutorial and Selected Readings in Interactive Graphics, 1980, pp. 244–254.
Blinn et al., "Clipping Using Homogeneous Coordinates", [Computer Graphics, vol. 12, No. 3, Aug. 1978], Tutorial: Computer Graphics, 1979, pp. 197–203.

Primary Examiner—Errol A. Krass
Assistant Examiner—Joseph L. Dixon
Attorney, Agent, or Firm—Alan H. MacPherson; Steven F. Caserza; Thomas S. MacDonald

[57] ABSTRACT

This data processing system for a pattern generator receives data specifying each quadrilateral element in a pattern to be generated by laser scanning or other technique. The scanning is accomplished by swaths. In the preprocessor, separate vectors are produced for the portion of each quadrilateral edge in each swath. A real time processor, including a "pipeline" or cascaded set of beam processors, is used to generate a bit map from these clipped edge vectors. The bit map itself is skew compensated to take into account relative movement between the laser scanner and the target during pattern generation.

24 Claims, 14 Drawing Figures

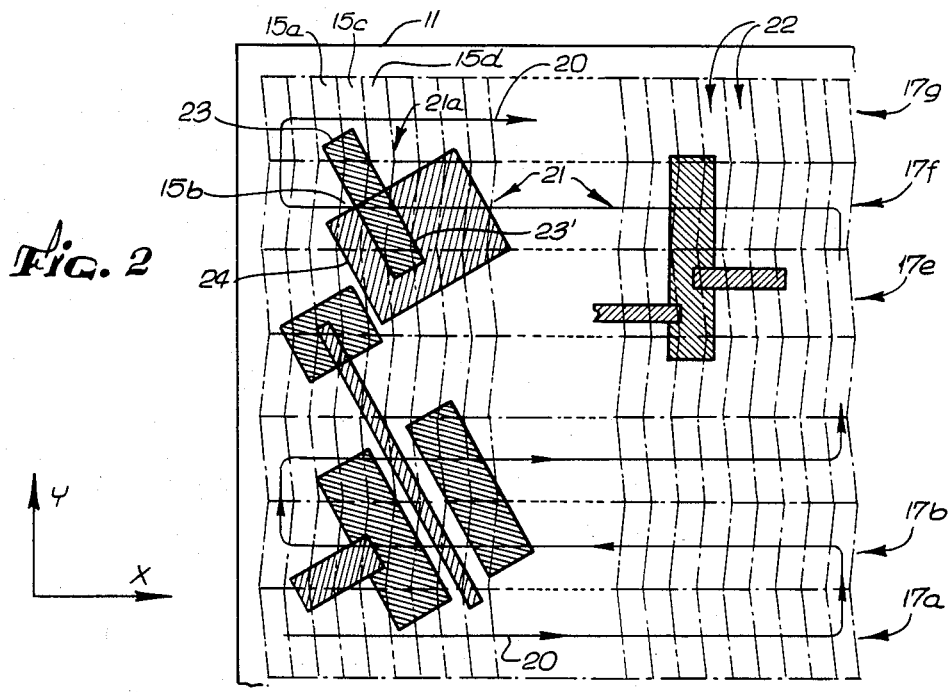
Fig. 2
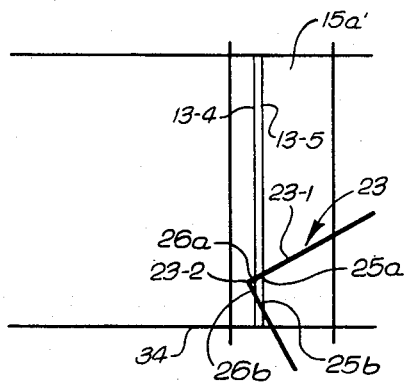
Fig. 3A
Fig. 3B
| | $X_{b3}$ | $X_{b4}$ | $X_{b5}$ |
|---|---|---|---|
| 720 | | | ON |
| 760 | | ON | |
| 800 | ON | | |
| 810 | OFF | | |
| 870 | | OFF | |
| 930 | | | OFF |
VECTOR FORMAT DATA
EDGE 23-1
 $X_s = 35.2$  $Y_s = 800$
 $X_e = 56$
 $\Delta y/\Delta x = +40$
 DIRECTION = +1 (ON)
EDGE 23-2
 $X_s = 35.2$  $Y_s = 820$
 $X_e = 98$
 $\Delta y/\Delta x = -1.5/2.8 = -.53$
 DIRECTION = -1 (OFF)

IMAGE SOURCE DATA
RECTANGLE FORMAT

RECTANGLE 23
L = 2.1
W = 0.5
α = 118°
X,Y = 4.1; 5.5

RECTANGLE 24
L = 1.6
W = 2.1
α = 118°
X,Y = 5.8; 5.2

PARTIAL CONTENTS OF BIT MAP PRECURSOR MEMORY ~ 45 ~ AFTER PROCESSING OF VECTORS FOR BLOCK 15b'

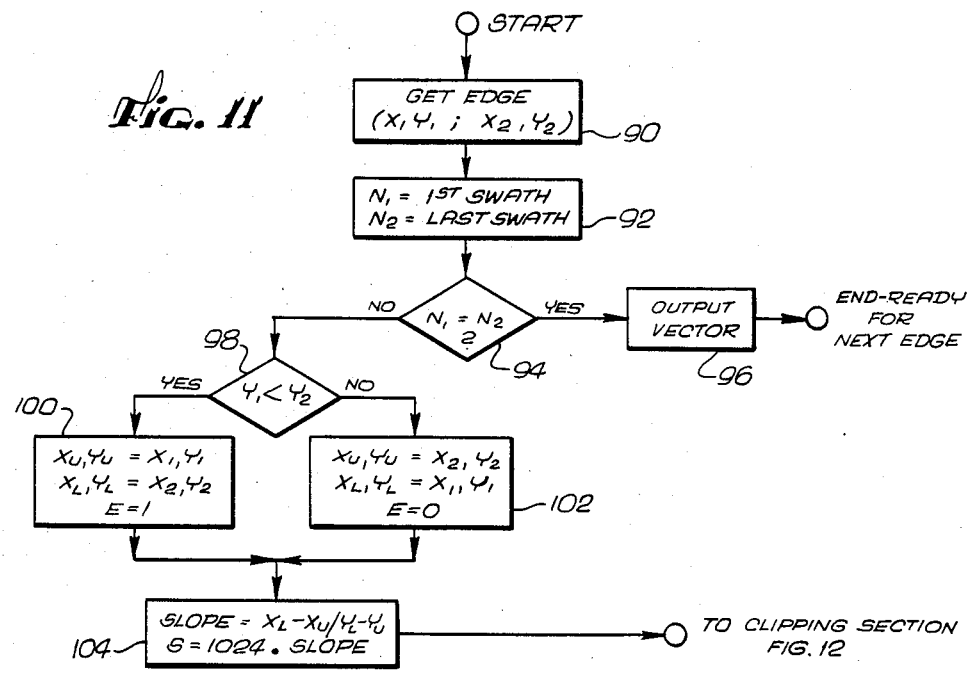
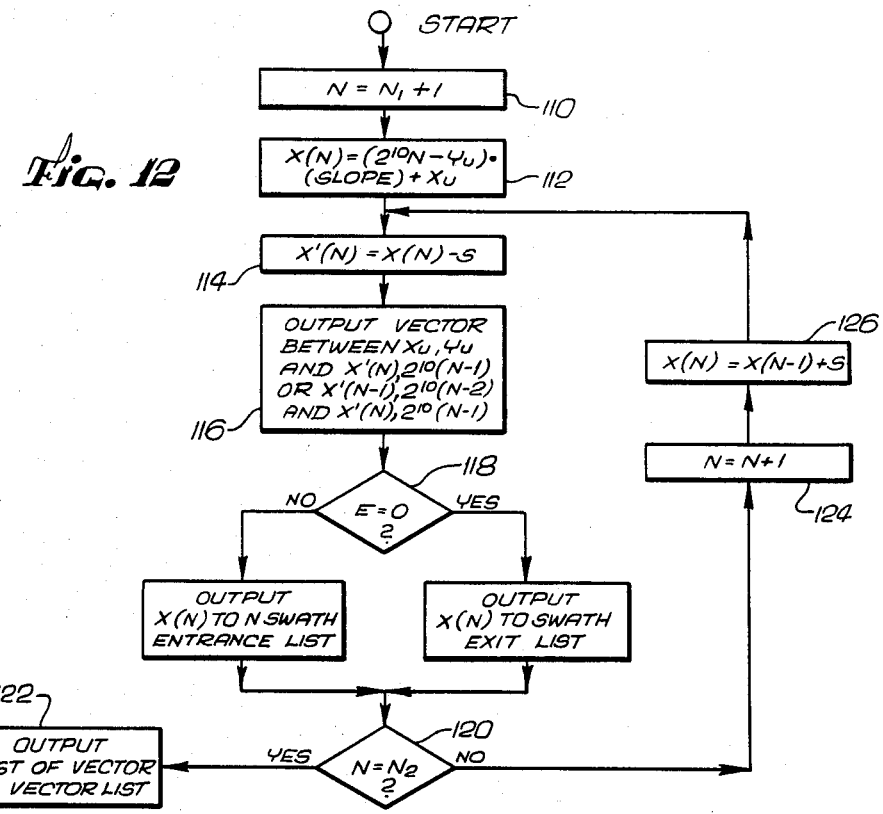

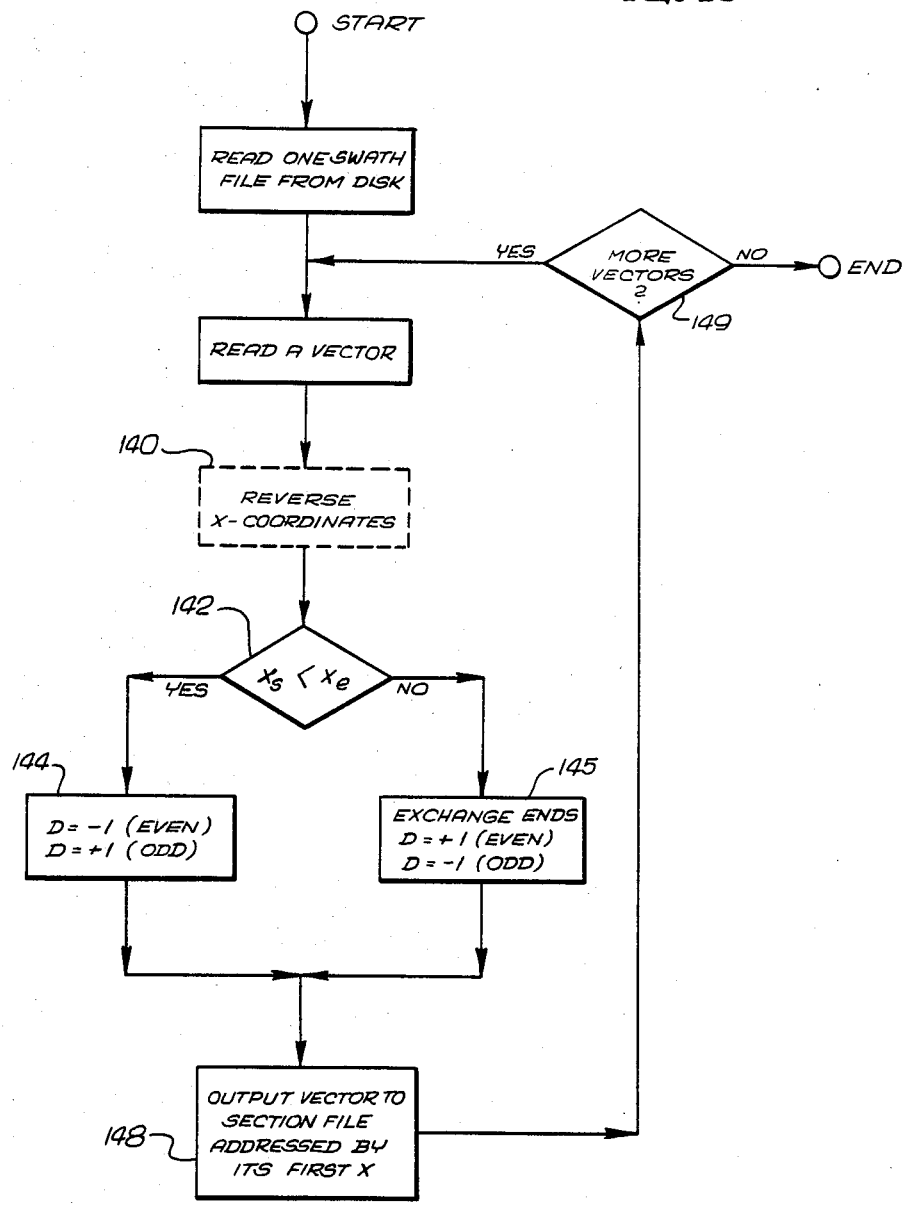

DATA HANDLING SYSTEM FOR A PATTERN GENERATOR

BACKGROUND OF THE INVENTION

1. Field of the Invention

The present invention relates to a system for processing image data for a laser pattern generator.

2. Description of the Prior Art

In the U.S. Pat. No. 4,541,712 entitled "Laser Pattern Generating System" assigned to TRE Semiconductor Equipment Corporation, the assignee of the present case, there is described a system useful for producing photolithographic masks or directly exposing image patterns on a semiconductor wafer or other target. A portion of that pattern generator 10 is shown in FIG. 1 herein.

To generate a pattern on a semiconductor substrate or other target 11, the beam from a laser 12 is split into a set of sixteen spaced parallel beams 13 by a splitter array 14. The set of beams 13 is repetitively deflected in the y-direction across a region 15' of the target 11 by a deflector 16 driven by appropriate electronics 16'. Advantageously, the target 11 is moved along the x-direction so that during consecutive deflections the set of beams 13 will scan across adjacent regions or blocks 15 of the target 11. In this manner an entire stripe or swath 17 of the target 11 will be covered block-by-block during successive deflections of the beam set 13. Thereafter, adjacent swaths 17' may be exposed in like manner by first appropriately moving the target 11 in the y-direction and then repeating the successive beam deflection operations.

Advantageously, each beam in the set 13 impinges on the target 11 at a different but adjacent position along the x-axis. (To avoid mutual interference, adjacent beams may be offset in the y-axis as illustrated at 18 in FIG. 1 and described in the above-identified copending application.) With such arrangement, each block 15 has a width of sixteen picture element ("pixel") positions along the x-axis. As the deflector 16 sweeps the beam set across a block 15, each beam crosses a set of consecutive picture element positions along the y-axis. In the illustrative system described herein, there are 1024 such y-axis locations in each block 15.

To form an image on the target 11, each beam in the set 13 is individually modulated or appropriately turned on and off by a corresponding one of a set of modulators 19. This modulation occurs while the beams are being deflected across each block 15.

FIG. 2 shows a typical pattern 21 which may be generated on a target 11 by the generator 10. The shaded areas represent regions where the beams have been turned on, for example, to expose a photosensitive coating on a mask used for integrated circuit production, or to expose such a coating situated directly on a semiconductor wafer. The shaded regions in the patterns 21 thus may represent e.g., regions where an oxide layer is to be removed from a semiconductor wafer to provide defined openings for the diffusion of dopants into a semiconductor substrate. However, the invention is not limited to such applications.

In FIG. 2, the generated pattern 21 is shown overlying a grid 22 which defines each of the actual blocks 15 that are swept by the set of beams 13. Of course, such grid would not actually appear on the target surface, and for that reason, it is drawn in phantom in FIG. 2. Note that the grid 22 is not rectilinear, but rather that the sides of the blocks in the swaths 17a through 17g are angled or skewed with respect to the y-axis. This results since, in the preferred embodiment of the generator 10, the x-direction movement of the target 11 takes place continuously, during the actual deflection of the beams 13. Therefore, the loci of points swept by the beam 13 during each deflection defines not a rectangle, but rather a non-rectangular parallelogram. Accordingly, one of the objectives of the inventive data handling system is to provide image data to the modulators 19 in a format which compensates for the block skewing that results from the lateral translation of the target 11 during the beam sweep.

Note also in FIG. 2 that alternate swaths are skewed in opposite directions. This results because, to minimize the time required to generate an entire pattern, alternate swaths are processed in opposite directions. In other words, during production of the swath 17a the target is moved from right to left, so that the beams 13 sweep successive blocks in the +x direction. During production of the next swath 17b the target is moved toward the right, so that successive blocks are swept in the −x direction. The resultant order of block scanning is indicated by the arrow 20. Another object of the present invention is to provide image data to the modulators 19 which takes into account the opposite direction of target travel on alternate swaths.

Another objective of the present invention is to provide a system for converting image data into a bit map format that can be used directly for controlling the modulators 19. To accomplish such control, the data must be available in real time, in the form of turn-on and turn-off commands to the modulators 19. That is, as the deflector 16 sweeps the beams 13 across a block 15, signals must be provided to the modulators 19 to turn on and turn off each individual beam during the deflection so as to create the desired pattern.

Consider, for example, the section 21a of the pattern 21 (FIG. 2) which consists of two overlapping rectangles 23 and 24. The upper left corner of the rectangle 23 lies within a block 15a. An enlarged but unskewed corresponding block 15a' is shown in FIG. 3A. The loci of the beams 13-4 and 13-5 (assuming no movement of the target 11) also are shown. Note that as these beams are swept downward, the beam 13-5 first must be turned on when it reaches the position 25a. Slightly later, the beam 13-4 is turned on when it reaches the position 26a. Later, the beam 13-4 and 13-5 are turned off in that order when they reach the points 26b and 25b respectively.

In typical design systems for laying out large scale integrated circuits, the information defining each graphic element in the LSI layout normally is not provided in a form which can be used directly for the real time control of a laser pattern generator. More typically, the information is provided in the form of a data list specifying each rectangular element in the pattern. FIG. 4 illustrates this for the pattern members 23 and 24. Each is specified as a rectangle having a certain length L, width W, center position (x, y) with respect to an arbitrary rectangular coordinate system, and an angle $\alpha$ specifying the angle between the longitudinal center line of the rectangle and the x-axis of the coordinate system. FIG. 4 shows typical numerical values (in arbitrary units) for the rectangular members 23 and 24 of the pattern 21.

This rectangle-format LSI pattern design data must be converted into a format for direct control of the pattern generator modulators 19, and this is another objective of the present invention.

An advantageous format for the real time control data for the modulators 19 is that of a bit map. This is a set of control data stored in a memory having a designated storage location corresponding to each of the pixels in the block being scanned. For the generator 10, such a bit map memory may contain 1024 storage positions (one for each vertical dot position) for each of the sixteen beams, for a total of 16,384 locations. The information from such bit map memory then may be supplied to the modulators 19 via a buffer 27 and appropriate modulator drive electronics 28 (FIG. 1) during actual deflection of the beam set 13 by the deflector 16. Thus it is a further object of the present invention to provide an image data handling system which will convert image source data, such as the rectangle list of FIG. 4, into stored bit map data that can be used in real time to control the pattern generator modulators.

One approach to accomplishing such data conversion is to utilize an intermediate vector data format in which each side of each rectangular graphic element is represented by a vector that specifies the turn-on or turn-off direction for the modulators 19. The two edge segments 23-1 and 23-2 of the rectangle 23 which are shown in FIG. 3A may represent such vectors. It is a further object of the present invention to provide a data handling system for a pattern generator that utilizes such intermediate vector format for the image data.

Such vector formatted data itself advantageously is converted into a bit map precursor, which may be a set of turn-on and turn-off control signals that are associated with respective beams. These signals are stored in an image buffer memory at locations associated with the deflection angle or vertical pixel position at which the respective beam is to be controlled.

A fragmentary portion of such bit map precursor memory contents is shown in FIG. 3B, and corresponds to the vector information of FIG. 3A. In this precursor, the column marked $x_{b4}$ represents the set of memory locations associated with the beam 13-4, while the column $x_{b5}$ is associated with the beam 13-5. The numbers along the ordinate represent memory locations corresponding to vertical pixel positions in the block 15. For example, the memory location 800 would correspond to the vertical position 800 which is about eight-tenths of the way between the top and the bottom of a block 15. For the beam 13-4, stored in the memory position 760 (for the column $x_{b4}$) is an "on" command indicating that the beam 13-4 is to be turned on at the corresponding block location or deflection angle, as indicated at the point 26a in FIG. 3A. A turn-off command is stored at location 870, corresponding to turn-off of the beam 13-4 at the point 26b.

The precursor memory contents in FIG. 3B do not take into account either the overlap of two rectangular image members (such as in the region 23' of FIGS. 2 and 4) or the skewing required by the lateral translation of the target 11 during pattern generation. However, it is a further object of the present invention to provide a data handling system which converts image data from a vector format to a bit map precursor format, and which also converts such precursor data into bit map information that does take into account both pattern element overlap and skewing due to lateral target movement.

Another consideration is the large amount of information which must be handled to create a typical large scale integrated circuit pattern. With present day technology, the pattern utilized during one processing step in the fabrication of an LSI may have some 70,000 quadrilateral members such as those exemplified by the rectangles 23 and 24. This may convert into a pixel matrix exceeding one billion bits. Current storage technology does not permit the economical storage and real time access of the entire one megabit or larger pixel image data. Therefore it is necessary to store the image data in a more compact format, and to generate the bit map in pieces, in real time synchronism with the repetitive beam sweep operations of the pattern generator.

Thus it is another object of the present invention to provide a data handling system for a pattern generator that can translate an extremely large number of quadrilaterals into a bit map which is created piecewise at a rate commensurate with the real time modulation data demands of the pattern generator.

SUMMARY OF THE INVENTION

These and other objects are achieved by a data handling system that includes a preprocessor and a real time processor. The preprocessor translates the image source data into a vector format. The vector information is sorted into an order corresponding to that in which the data is utilized by the real time processor.

The real time processor accepts the sorted vector format data, and from this generates appropriate bit maps containing beam modulation information that is directly fed to the modulators 19 during each sweep of the beams 13. The final bit map data is corrected for skewing and appropriately takes into account the overlapping of quadrilaterals in the generated pattern.

In the preprocessor, each vector defines an edge of a quadrilateral included in the pattern 21. If such an edge crosses a swath boundary, separate vectors are produced for the portion of the edge in each swath. The vectors then are sorted by swath, and for each swath are arranged in x-axis order going from left end point or right end point depending on the direction of target movement for the corresponding swath. The translated and presorted data then is stored for use by the real time processor.

The sorted data is utilized by the real time processor in the order that the pattern generator scans the target. The data is handled in a block-by-block manner for each swath.

The real time processor includes a "pipeline" or cascaded set of beam processors each associated with a respective one of the beams 13. One vector at a time is fed into this pipeline. The first beam processor, associated e.g., with the leftmost beam, determines whether the quadrilateral edge represented by that vector will be intersected by the associated beam during scanning of a block. If so, an appropriate entry is made into the portion of a bit map precursor memory corresponding to the associated beam. The entry is made in a memory position corresponding to the vertical position within the block at which the beam will cross the edge defined by the vector.

Since the portion of the vector information required to control the leftmost beam is utilized by the first beam processor in the pipeline, that information may be deleted or "nibbled away" from the vector. The resultant nibbled vector then is passed down the pipeline to the beam processor for the next (i.e., second) beam.

That second beam processor performs a like operation, storing in the bit map precursor memory appropriate beam turn-on or turn-off information. The vector is further nibbled away, and passed on to the succeeding beam processors. Thus when a single vector has been processed through the entire pipeline, there will be stored in the bit map precursor memory appropriate turn-on or turn-off information corresponding to the portion of the quadrilateral edge represented by that vector and lying within the block for which data is being processed.

Edge sections of two or more quadrilaterals may lie within a single block, as for example, in block 15b of FIG. 2. To accommodate this situation, plural vectors are processed by the pipeline to create the bit map precursor for a single block. As one nibbled vector is forwarded from the first to the second beam processor, another vector, representing another edge, is fed into the pipeline and handled by the first beam processor. When sufficient vectors have been passed through the pipeline to ensure that all edges within a block have been defined, the bit map precursor memory will contain all of the turn-on and turn-off information required to generate the corresponding block image.

At that time, the bit map precursor data is subjected to an appropriate skewing correction operation to take into account the lateral movement of the target 11 during the scanning of each block. The result of such skew correction is a set of bit map data corresponding exactly to the pattern of a block as it is to be scanned on the target. The bit map data comprises turn-on and turn-off control signals for each of the individual beams, for all vertical positions within the block. This data is fed to the modulators 19 in real time as the deflector 16 causes the beams 13 to scan across the block.

A double buffering arrangement is used in connection with the pipeline of beam processors. Thus while bit map precursor information for one block is being subjected to skewing correction, the vector data for the next block is being processed by the pipeline and a corresponding bit map precursor is being created in an alternate buffer memory.

The pipeline bit map precursor generation and the skewing correction are carried out in real time, so that as the scanning of each block is completed, a new bit map for the next scan immediately is available.

BRIEF DESCRIPTION OF THE DRAWINGS

The following description of the invention will be made with reference to the accompanying drawings, where like numerals designate corresponding elements in the several figures.

FIG. 2 is a greatly enlarged view of part of a pattern which may be generated using the system of FIG. 1, with the arrangement of blocks and swaths shown in phantom.

FIG. 3A illustrates the typical vector format data which is utilized by the real time processor portion of the system of FIG. 1, and FIG. 3B shows the partial contents of a bit map precursor memory corresponding to the data of FIG. 3A.

FIGS. 10, 11, 12 and 13 are flow charts illustrating various data handling functions of the preprocessor portion of the system of FIG. 1.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention best is determined by the appended claims.

Figure 1:
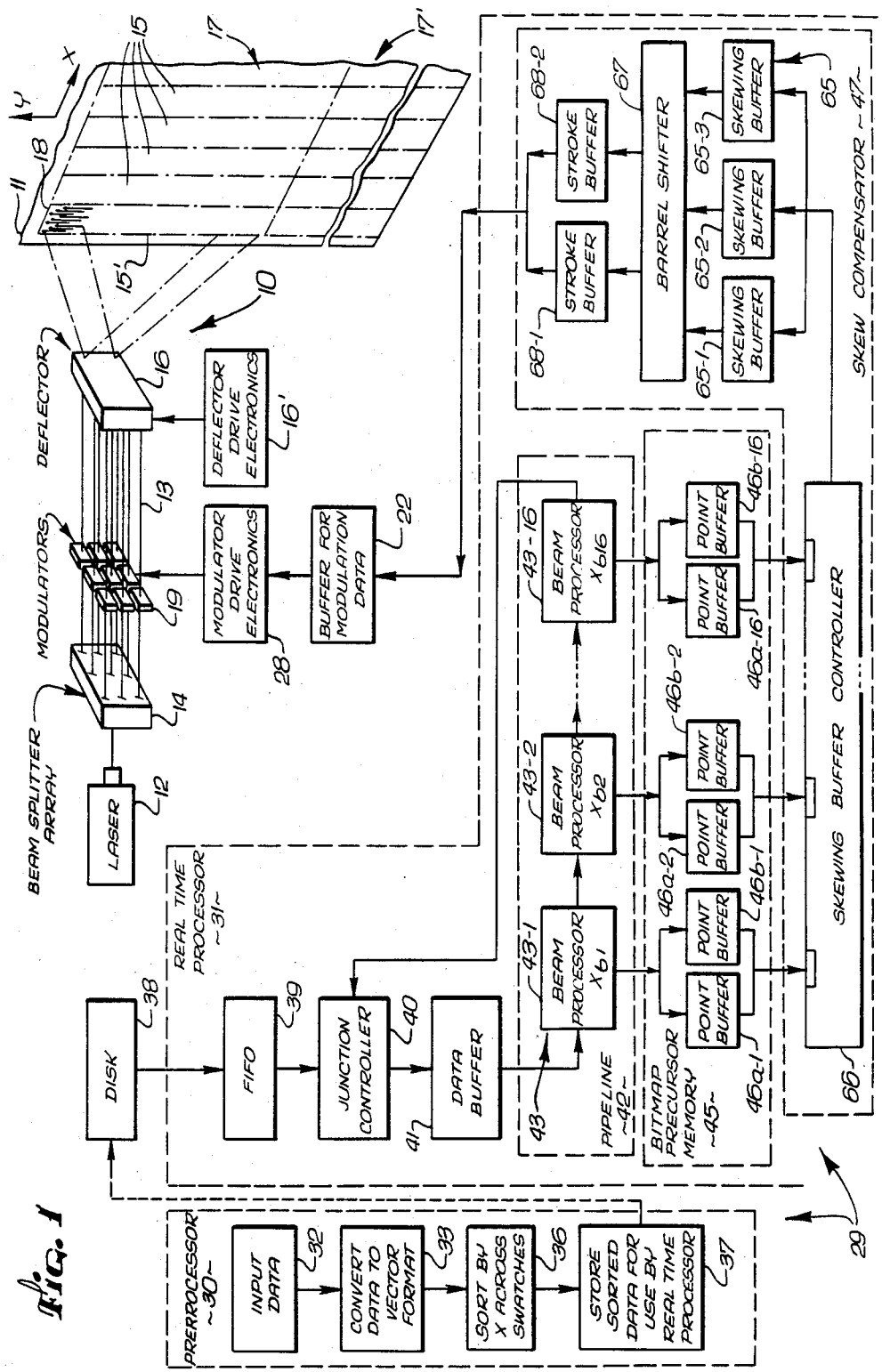
FIG. 1 is a block diagram of the inventive data handling system for a pattern generator.

Referring to FIG. 1, the inventive data handling system 29 incorporates a preprocessor 30 and a real time processor 31. Details of the preprocessor 30 are described below in connection with FIGS. 8 through 13. However, the basic functions of the preprocessor 30 are shown in FIG. 1.

Figure 4:
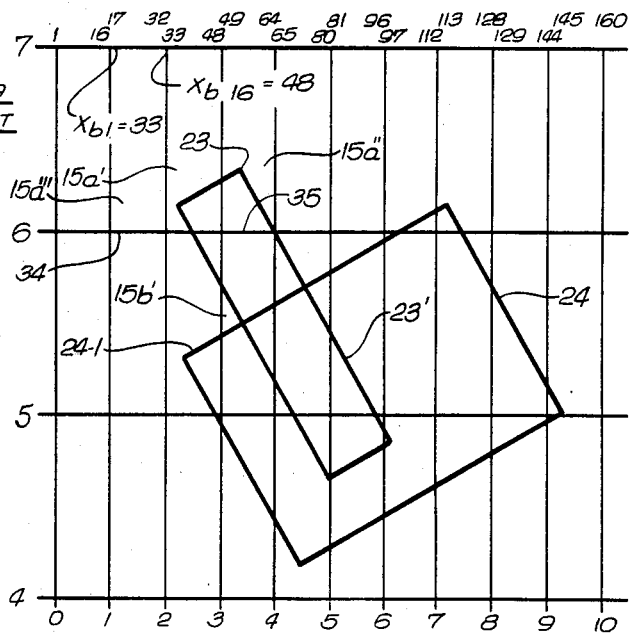
FIG. 4 is a pictorial representation of the image source data in rectangular format, as it might be provided to the preprocessor portion of the data handling system of FIG. 1.

Initially, image data is inputted (block 32) to the preprocessor 30, typically in the form of a data list specifying each rectangular element in the pattern, using the data format of FIG. 4. Next, (block 33), this data is converted to a vector format such as that illustrated in FIG. 3A. In such format, each edge of each rectangle may be represented by a vector or set of numerical information representing the origin or start $(x_s, y_s)$ of that edge, the end position $(x_e)$ of that edge along the x-axis, the slope $(\Delta y/\Delta x)$ of the edge, and the beam turn-on or turn-off "direction". This beam direction advantageously is specified by the value $+1$ if the beam is to be turned on as it crosses the edge, or by the value $-1$ if the beam is to be turned off as it crosses the edge. Typical vector format values for the edges 23-1 and 23-2 of the rectangle 23 are given in FIG. 3A.

As described hereinbelow, if the edge of a rectangle crosses a swath boundary (such as the boundary 34 in FIGS. 3A and 4), it is advantageous to represent such edge by separate vectors each limited to the portion of the edge within the respective swath. Such edge vector clipping also is carried out by the preprocessor 30.

When such clipping is done, it is necessary to produce an artificial vector along the swath boundary to ensure initial beam turn-on when the adjacent block is scanned. Thus e.g., with respect to the rectangle 23, the preprocessor 30 will create an artificial turn-on vector 35 (FIG. 4) along the swath boundary 34.

Next the vectors which lie within each swath are sorted (block 36) in accordance with their starting positions in the x-direction. If the swath is being generated from left to right (as for example the swath 17a of FIG. 2), the sorting is done with respect to the left or origin $x_s$ end of each vector. For scanning from right to left (as in the swath 17b), the sorting could be by right end point. However, to simplify data handling throughout the system 29, for such swaths the x-coordinates for all vectors may be reversed, and the sorting then carried out from lowest to highest (reversed) $x_s$ origin value.

The result of such sorting is an ordered list of vectors which define each rectangle angle edge that lies within a particular swath, with the vectors arranged in the order of beam scanning the x-direction for that swath. Since the data conversion and sorting operations in the preprocessor 30 may take considerable time, they are carried out in advance of the actual pattern production by the generator 10. Accordingly, the sorted data produced by the preprocessor is stored (block 37) on disk or other media for subsequent use by the real time processor 31.

As summarized hereinabove, the real time processor 31 cooperates with the pattern generator 10 to convert the sorted vector data from the proprocessor 30 into turn-on and turn-off commands for the modulators 19. To this end, the stored data from the preprocessor 30 is read in from a disk 38 or other input device through a first-in, first-out (FIFO) buffer 39 as the generator 10 is producing the image on the target 11. Since the vectors for each swath have been sorted in accordance with their x-axis origin points, these vectors will be supplied from the FIFO 39 in the order that the corresponding rectangle edges will be produced during the generation of a swath on the target 11.

These vectors are fed one at a time via a junction controller 40 and a data buffer 41 into a pipeline 42 consisting of sixteen beam processors 43-1 through 43-16 each associated with a respective one of the beams in the set 13. Cooperating with the beam processors 43 is a bit map precursor memory 45 having two sets of point buffers 46a-1 through 46a-16 and 46b-1 through 46b-16. The two sets 46a, 46b of point buffers are used alternately during the processing of image data associated with consecutive non-skew corrected blocks. Advantageously, each of the point buffers (e.g., the point buffer 46a-1) in the precursor memory 45 has 1024 storage locations each of which can store a multibit number. Thus each point buffer has a storage location corresponding to each vertical (y-axis) pixel position for a corresponding one of the beams 13.

With respect to the block for which vector data presently is being processed, each of the beam processors 43 is assigned to a corresponding beam. Thus when vectors for the un-skew corrected block 15a' of FIGS. 3A and 4 are being handled in the pipeline 42, the beam processors 43-1 through 43-16 respectively will be associated with beam x-axis locations $x_{b1}=33$ through $x_{b16}=48$ (as indicated along the top of FIG. 4). If the set of point buffers 46a-1 through 46a-16 then are in use, these will respectively be associated with corresponding x-axis beam addresses 33 through 48.

If a particular beam processor 43 ascertains that the vector it is handling defines an edge that passes through its associated x-axis beam coordinate, the processor will add into the appropriate storage location in the associated point buffer 46 either a +1 or −1 in accordance with the "direction" value of the vector. For example, if the vector corresponding to the edge 23-1 of FIG. 3A is being processed by the beam processor 43-4 (not shown) associated with the beam x-axis value $x_{b4}=36$, the value +1 (since this is a beam turn-on edge vector) will be entered into the memory location 760 of the associated point buffer 42a-4 (not shown).

If two or more rectangle edges should intersect the same pixel position, then as the vectors for those edges are processed by the same beam processor, the respective turn-on or turn-off direction values will be added into the corresponding storage location of the point buffer. When all of the vectors associated with a particular block have been processed by the pipeline 42, the net numerical value in the particular point buffer storage location will determine whether a turn-on or turn-off control signal is actually produced for the corresponding modulator 19. If the net value is +1 or greater, the beam is turned on (or remains on if it previously has been turned on). If the numerical value is less than +1 (that is, zero or negative), the beam is turned off.

After the pipeline 42 has processed all of the vectors associated with a particular block, the operative set of point buffers in the memory 45 will contain a bit map precursor which already has taken into account the overlapping of rectangles within that block. This bit map precursor information then is corrected for skewing, under control of a skew compensator 47, while the alternate set of point buffers is being loaded with bit map precursor information for the next successive non-skew corrected block.

The real time processor 31 works in a block-by-block manner. An assumption is made that no more than 1024 vectors cross any block, so when the pipeline 42 has processed 1024 vectors, the pipeline is ready to start processing vectors for the next block. Data is loaded from the disk 38 via the FIFO 39 and the controller 40 into the data buffer 41. When the first 1024 vectors have been loaded into the data buffer 41, the pipeline 42 will process all of these vectors for the first block, transsforming the vector data into the bit map precursor for that block. The portions of any vector that define edges within the first block are nibbled away. The remainder of any vectors that extend beyond this block are loaded back into the data buffer 41 by the junction controller 40, while vectors that do not extend beyond this block are discarded. New vectors are loaded from the FIFO 39 to replace the discarded vectors. If new data from the FIFO is not yet available due to a delay caused by the disk 38, a null vector, which is used solely for "bookkeeping" purposes, is loaded into the buffer 41. After all 1024 vectors initially stored in the data buffer 41 have been processed, the pipeline 42 is ready to process the next set of 1024 vectors corrected stored in the buffer 41 to create the bit map for the next non-skew corrected block.

While the processed data (i.e., the bit map precursor) one set of point buffers 46a is being skew corrected, the pipeline 42 can process the next 1024 vectors and load bit map procursor data for the next block into the alternate set of point buffers 46b. When the pipeline 42 has completed processing this set of 1024 vectors for the second block, the skew compensator 47 will have completed processing the previous bit map precursor from the buffers 46a. Thereafter, the pipeline 42 will start processing the third set of 1024 vectors and loading the resultant bit map precursor data into the first set of point buffers 46a. This cycle is repeated until all of the vectors have been processed.

To implement this block-by-block scheme, the beam processors 43 are temporarily assigned a range of beam x-axis coordinates $x_{b1}$ through $x_{b16}$ that coincides with the x-axis coordinates of the un-skew corrected block (FIG. 4) currently being processing. The first beam processor 43-1 is assigned the leftmost coordinate in the block, the second beam processor 43-2 is assigned the second to leftmost coordinate, etc. When 1024 vectors have been processed by the pipeline 42, each beam processor 43 will have its temporary x-coordinate value changed to the appropriate value for of the next block to be processed.

Figure 5:
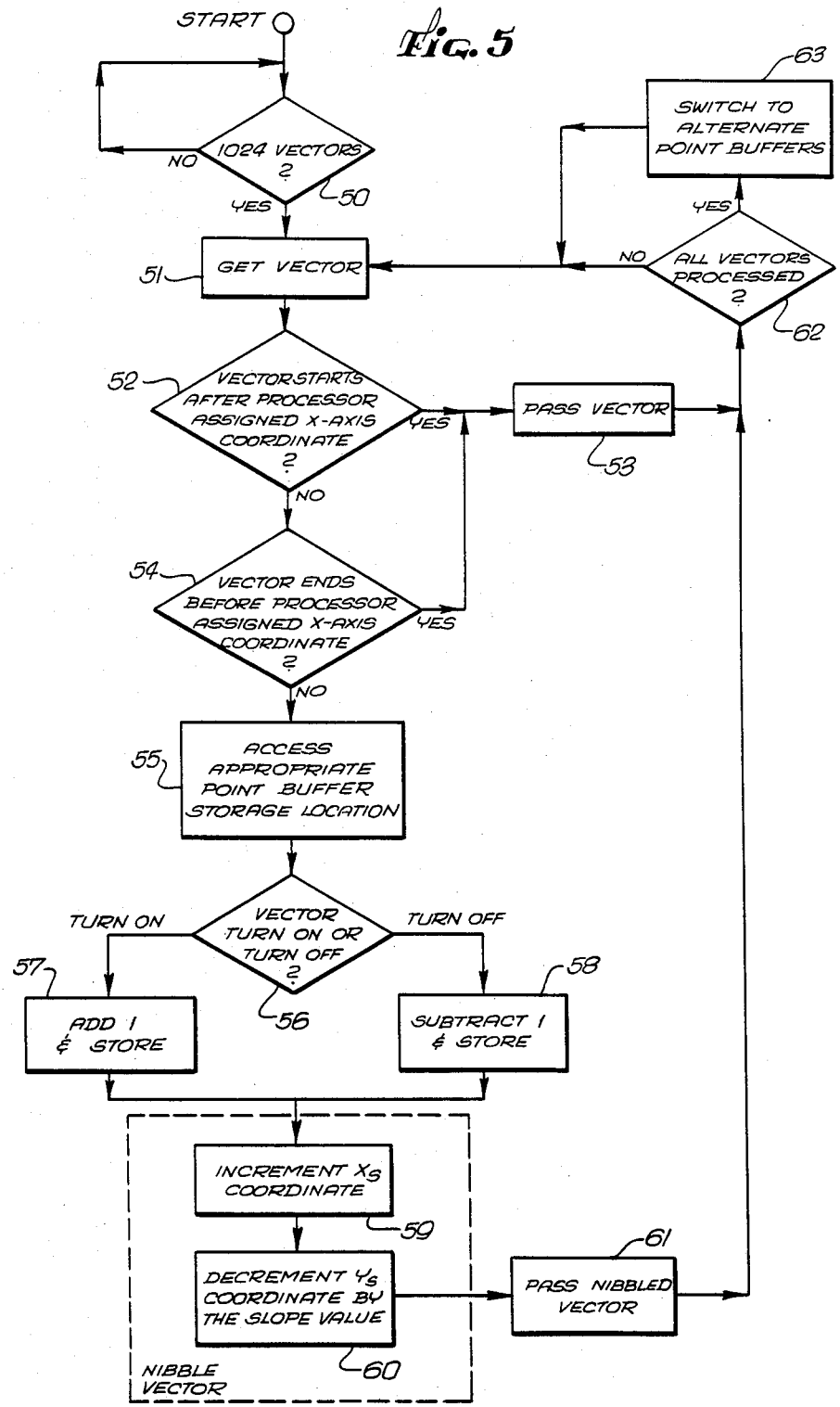
FIG. 5 is a flow chart of the operations carried out by the beam processor pipeline and bit map precursor memory components of the system of FIG. 1.

Each beam processor 43 performs the same tasks, which are shown in the flow chart of FIG. 5. The first processor 43-1 receives vectors from the data buffer while all of the other processors 43-2 through 43-16 obtain their data from the previous processor in the pipeline. Initially (block 50) the processor 43-1 waits until the 1024 vectors for the current block are ready in the buffer 41. Then (block 51) it gets the first vector, which, owing to the sorting which was previously done, will have the leftmost or lowest x-axis value for the block. Each beam processor first checks (block 52) the x-axis start coordinate of the vector to determine whether the corresponding edge starts after this beam processor's assigned x-axis coordinate value. Thus in the example of FIG. 3A, the beam processor 43-1 will merely pass (block 53) the vector 23-1 to the next processor in the pipeline.

If the vector does represent an edge that starts before this beam processor's assigned x-coordinate, the vector end coordinate ($x_e$ in FIG. 3A) is examined (block 54) to make sure that the corresponding edge does not end before that processor-assigned coordinate. If the edge does end before, the vector is ignored and is passed (block 53) to the next processor in the pipeline 42.

If the beam processor finds that the vector intersects its assigned x-coordinate, it will take the present y-axis coordinate of this vector and access (block 55) the associated location in the active point buffer 46 dedicated to that beam processor. For example, the vector 23-1 (FIG. 3A) intersects the x-coordinate of the beam processor 43-4 at the y-axis value 760, hence the processor 43-4 will access storage location 760 of the active point buffer 46a-4.

The processor will examine (block 56) the vector to determine its "direction". The beam processor will add one to contents (block 57) of the appropriate point buffer storage location if it is a turn-on vector, or will subtract one (block 58) from the previous contents of the accessed storage location if it is a turn-off vector. Thus the net numerical value of the contents of a point buffer storage location can be positive, zero or negative.

Next, the vector then must be altered for use by the next beam processor. This is accomplished by "nibbling down" the vector. The $x_s$ start coordinate of the vector is incremented by one (block 59). The $y_s$ coordinate of the vector is decremented (block 60) by the slope value. The resultant vector then is passed (block 61) to the next beam processor in the pipeline 42. After passing the vector, the processor will determine (block 62) whether all 1024 vectors for the present block have been processed. If so (block 63) the beam processor will switch to the alternate set of point buffers 46. The effective x-coordinates of all beam processor also are changed to the appropriate values for the next block.

To summarize how this vector "nibbling" operation is carried out by the pipeline 42, consider the vector specified in FIG. 3A which corresponds to the edge 23-1. The vector consists of the following values:
vector starting point ($x_s$, $y_s$) = 35.2, 800
vector x-axis end position ($x_e$) = 56
slope ($\Delta y$, $\Delta x$) = +40
direction = +1 (turn-on).

When the pipeline 42 is handling the vectors for the unskewed block 15a' (FIGS. 3A and 4), the beam processor 43-1 is associated with the beam x-axis address $x_{b1}$=33, the beam processor 43-2 is associated with the address $x_{b2}$=34 and the beam processor 43-16 is associated with the beam address $x_{b16}$=48.

When the vector for the edge 23-1 is supplied to the beam processor 43-1, a comparison is made (block 52, FIG. 5) between the vector x-axis start address ($x_s$=35.2) and the assigned beam x-axis address ($x_{b1}$=33) of that beam processor. Since the start address is subsequent to the assigned x-axis coordinate of the beam processor, meaning that the first beam does not intersect the edge 23-1, the vector is passed unchanged (block 53, FIG. 5) to the next beam processor 43-2. Similarly, that processor will pass the vector unchanged to the third beam processor 43-3, which corresponds to the first beam 13-3 that intersects the vector 23-1 (neglecting skew correction).

In the beam processor 43-3, a comparison is made (block 54, FIG. 5) between the vector x-axis end address ($x_e$=56) in the assigned address of the beam processor 43-3. Since the vector ends at a later x-axis coordinate, the processor recognizes that its assigned beam does intersect the present vector, and the actions indicated by the block 55-60 of FIG. 5 are carried out.

First, the appropriate point buffer storage location is ascertained by reference to the present y-axis start address ($y_s$=800) of the vector. This $y_s$ address indicates that the associated beam 13-3 will intersect the edge 23-1 at pixel location 800 (where such vertical pixel locations range from 1 through 1024 as indicated in FIG. 3A). The corresponding point buffer location 800 is accessed (block 55).

Next, the "direction" value of the vector is investigated (block 56). Since this is a turn-on vector, the value +1 is added (block 57) to the contents of the active point buffer memory in storage location 800. If data is currently being loaded into the point buffers 46a, the value +1 will be added into the prior contents of the storage location 800 of the point buffer 46a-3.

The vector then is "nibbled away" in preparation for its passage to the next beam processor 43-4. First, the present x-axis starting address ($x_s$=35.2) is incremeted by one, to obtain the new value ($x_s$=36.2). The y-axis address ($y_s$=800) then is decremented by the slope value ($\Delta y/\Delta x$=+40). In other words, the value (+40) is subtracted from the present y-axis starting address to obtain a new value $y_s$=(800−40)=760. Accordingly, the nibbled vector which is passed (block 61) to the next beam processor 43-4 will have the new starting end coordinates ($x_s$=36.2, $y_s$=760). As a result, that next beam processor 43-4 will add a +1 (the turn-on direction value) into the storage location 760 of the associated active point buffer 46a-4.

If a particular vector is associated with an edge (such as the edge 23-1 of FIGS. 3A and 4) which extends into the next block 15a'', that the nibbled vector that is passed along by the last beam processor 43-16 will have a current x-axis start address ($x_s$=49.2) that is less than the x-axis end address ($x_e$=56) of the vector. This situation is recognized by the junction controller 40 which then will include the remaining nibbled vector as one of the new set of 1024 vectors that is to be processed by the pipeline 42 for the next block 15a''.

On the other hand, if the vector is associated with an edge that terminates within the currently processed block, at one of the beam processors 43 the x-axis start address ($x_s$) will be incremented (block 59) to a value which is greater than the end address ($x_e$). When that vector is received by the next beam processor in the pipeline 42, this situation ($x_s > x_e$) will be recognized (block 54) and this "completely nibbled away" vector will be passed (block 53) unchanged through the remaining beam processors back to the junction controller 40. The controller 40 will recognize that the edge associated with that vector now has been completely processed, and this completely nibbled away vector will not be included in the set of vectors assembled by the controller 40 for the next block to be processed. In its stead, the controller 40 will utilize a new vector from the FIFO 39 (or a null vector if no replacement vector is available from the FIFO 39).

Figure 6:
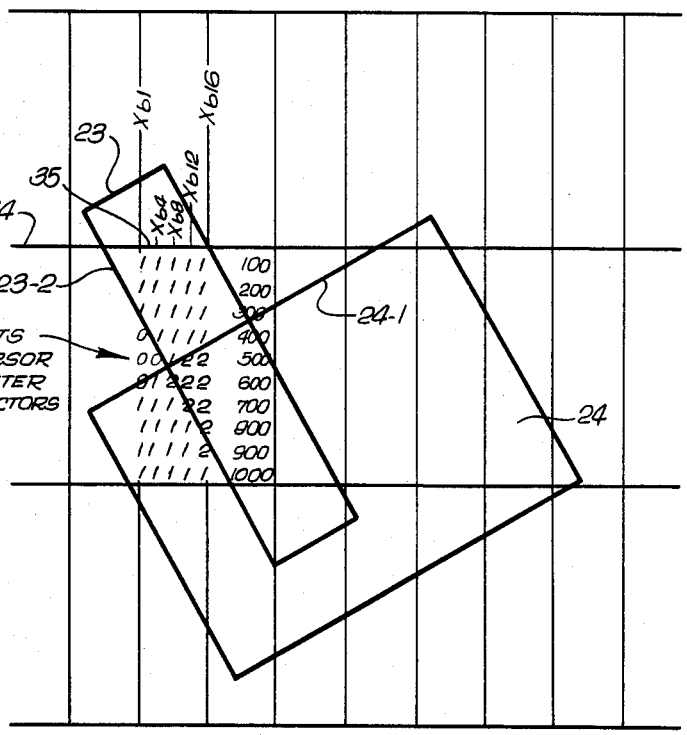
FIG. 6 is a pictorial representation of typical contents of the bit map precursor memory in the system of FIG. 1.

The manner in which turn-on and turn-off data is handled for overlapping rectangles is illustrated in FIG. 6. Here, the partial contents of the bit map precursor memory 45 is shown after processing of all of the vectors for the non-skew corrected block 15$b'$ of FIG. 4. Specifically, the contents of the point buffers 46a (or 46b) for the x-axis beam locations $x_{b1}$, $x_{b4}$, $x_{b8}$, $x_{b12}$ and $x_{b16}$, and for the vertical positions 100, 200, 300 . . . 1000 are shown.

All of the memory contents for vertical positions 300 or less are "1", resulting from the artificial turn-on vector 35 at the swath boundary 34. At vertical position 400 the contents of the point buffer 46a-1 associated with the beam address $x_{b1}$ becomes "0" resulting from the turn-off vector 23-2. At the vertical position 500, the contents of each point buffer 46a-8 through 46a-16 is "2" resulting from the turn-on vector 24-1. At the location 700, the contents of the point buffer 46a-8 has been reduced to "1" by the turn-off vector 23-2.

As is described below, the actual beam turn-on and turn-off signals are established from the net contents of the bit map precursor memory 45. In general, if the numerical value stored in a particular point buffer location is greater than zero, a turn-on command is issued to the appropriate modulator 19. If the value is zero or negative, a turn-off instruction is issued. Thus for the illustration of FIG. 6, only in those block regions corresponding to locations where the bit map precursor memory 45 has the contents "0" will the associated beams be off. Elsewhere, the beams will be on. Thus the appropriate beams will be on to create both the non-overlapping and overlapping segments of the rectangles 23 and 24 which fall within the un-skew corrected block 15$b'$.

Figure 7:
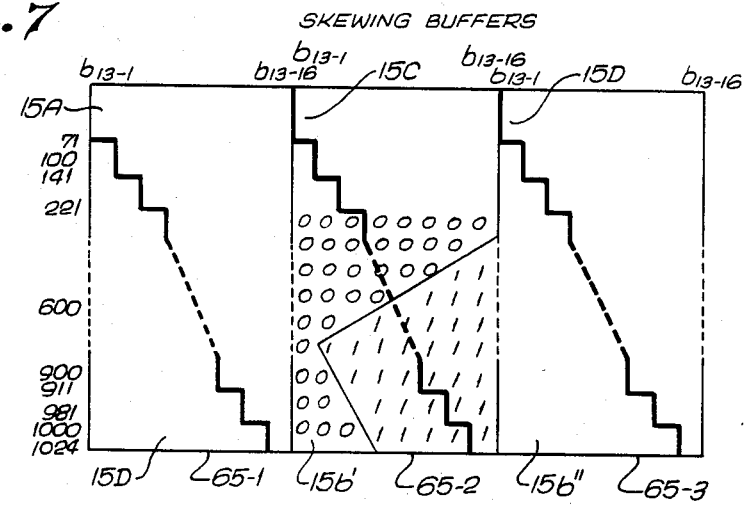
FIG. 7 is a pictorial representation of the skewing buffers utilized by the skew compensator in the system of FIG. 1, and illustrates the manner of data readout from these buffers under control of a barrel shifter.
Figure 8:
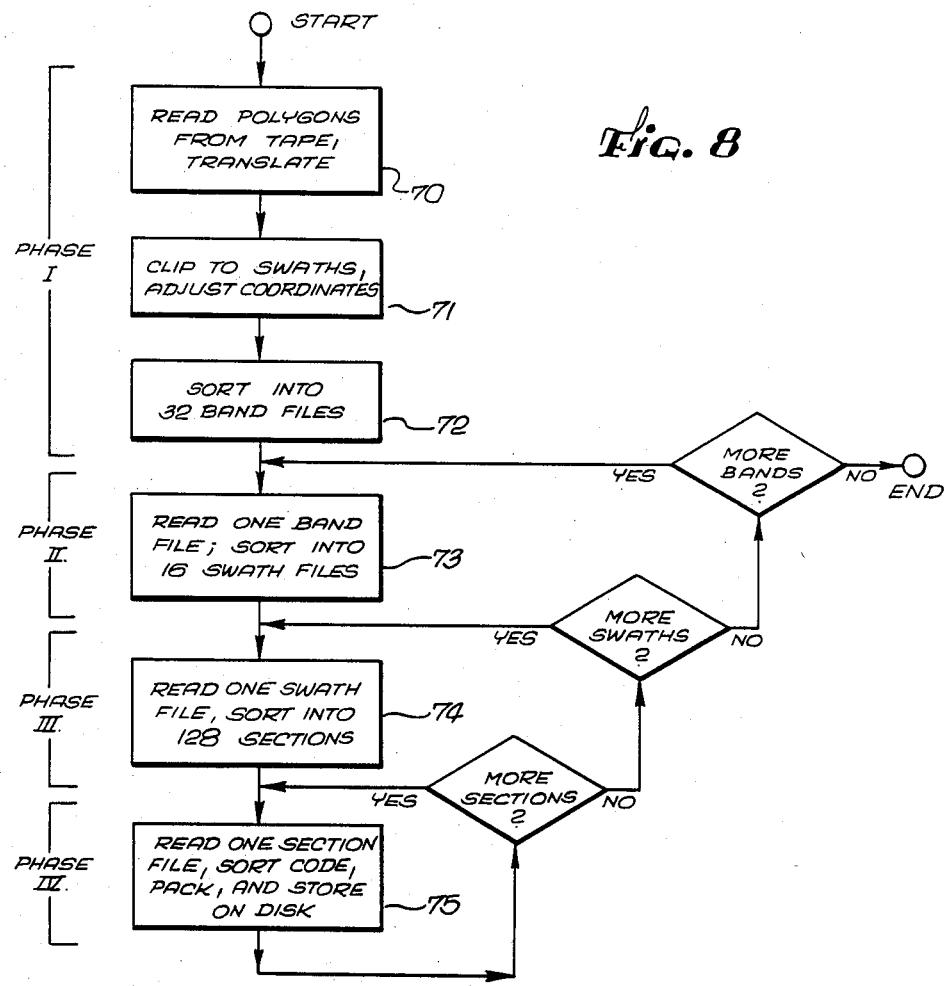
FIG. 8 is a flow chart showing the major phases of operation of the preprocessor portion of the system of FIG. 1.

Skew correction is carried out by the skew compensator 47, the operation of which is illustrated diagrammatically in FIG. 7. Recall from FIG. 2 that during generation of the swath 17g the target 11 is being moved laterally in the $-x$ direction, so that each of the beams 13 scans across a path that slants downward and toward the right. Thus the bit map precursor assembled in the memory 45 for a single non-skew corrected block (such as the block 15$a'$ of FIGS. 3A and 4) will not contain all of the information necessary to modulate the beams 13 during production of the actual block 15a. Indeed, that actual modulation information will contain data from parts of two un-skew corrected blocks.

The manner in which this data is obtained is illustrated in FIG. 7. The skew compensator 47 incorporates three skewing buffers 65-1, 65-2 and 65-3, the loading of which is directed by a skewing buffer controller 66 (FIG. 1). Each of the skewing buffers 65 has sixteen sets of 1024 storage locations, each set being associated with a respective beam 13. The corresponding beam-associated column addresses of the skewing buffer 65 are identified as $b_{13-1}$ through $b_{13-16}$ in FIG. 7.

When the bit map precursor for each non-skew corrected block is obtained in one of the alternate buffers 46a, 46b of the memory 45, it is transferred to an appropriate one of the skewing buffers 65. Thus, the bit map precursor for the block 15$a'''$ may be transferred to the skewing buffer 65-1, the bit map precursor for the block 15$a'$ then will be transferred to the buffer 65-2 and the bit map precursor for the block 15$a''$ will be transferred to the skewing buffer 65-3. Of course, these transfers will take place sequentially. In other words, while the bit map precursor for the block 15$a'$ is being assembled by the pipeline 42 into the point buffers 46a, the previously assembled bit map precursor for the block 15$a'''$ will be transferred from the buffers 46b into the skewing buffer 65-1. Then, when assembly of the bit map precursor for the block 15$a'$ has been completed, that information will be transferred from the point buffers 46a into the skewing buffer 65-2 during the time that the pipeline 42 is assembling in the point buffers 46b the bit map precursor for the block 15$a''$.

Advantageously, as the bit map precursor data is transferred from the point buffer set 46 to the corresponding skewing buffer 65, a determination is made at each point location as to whether or not the contents of the corresponding point buffer storage location is +1 or greater. If it is, a "1" is entered into the corresponding position in the appropriate skewing buffer 65. Such a "1" indicates that the corresponding beam must be on at the designated vertical location. Similarly, if the contents of the point buffer location is "0" or negative, a "0" is entered into the corresponding location in the skewing buffer 65, indicating that the associated beam must be off at that vertical location. This is indicated by the contents of the skewing buffer 65-2 in FIG. 7, which represents the un-skew corrected block 15$a'$.

The actual bit map information required to generate an actual skewed block 15 will be contained in contiguous portions of a pair of skewing buffers 65. This is illustrated by the regions 15A, 15C and 15D shown in heavy outline in FIG. 7. These designate the portions of the skewing buffers 65 that will contain the correct, skew compensated bit map information for generation of the actual blocks 15a, 15c and 15d (FIG. 2) respectively.

Readout of the bit map information from the respective blocks 15A, 15C and 15D is accomplished by a barrel shifter 67 which outputs the data alternately into one or the other of a pair of stroke buffers 68-1 and 68-2. For example, after the skewing buffers 65-1 and 65-2 have been loaded with bit map information relating to the un-skew corrected blocks 15$a'''$ and 15$a'$ respectively (and while the skewing buffer 65-3 is being supplied with bit map information for the un-skew corrected block 15$a''$), the barrel shifter 67 will transfer the data from the region 15A of the buffers 65-1 and 65-2 into the stroke buffer 68-1. As a result of this transfer, a stroke buffer 68-1 will contain an exact bit map corresponding to the desired pattern for the actual, skewed block 15a. This bit map data will be transferred to the modulation data buffer 27 and from there used to control the modulators 19 in real time as the beams 13 are being deflected across the actual block 15a.

Similarly, after the skewing buffer 65-3 has been filed with the bit map information corresponding to the un-skew corrected block 15a", the barrel shifter 67 will transfer the bit map information from the region 15C into the stroke buffer 68-2. That bit map then will be ready for supply to the modulators 19 (via the buffer 27 and the drive electronics 28) during the actual sweep of the beams 13 across the block 15c on the target 11.

Information for the next block 15d will be obtained from the region 15D (FIG. 7) which encompasses portions of the skewing buffers 65-3 and 65-1. The barrel shifter 67 will keep track of the actual locations in the various skewing buffers 65 from which the requisite information must be extracted to produce the skew-compensated bit maps that are temporarily stored in the stroke buffers 68 and actually supplied to the pattern generator 10.

In this regard, selection of those addresses for transfer of data into the stroke buffer 68 is determined as a function of the lateral travel rate of the target 11 during pattern generation. In the illustration of FIG. 7, the target 11 moves to the left (as viewed in FIG. 2) by a x-axis distance equal to the spacing between two adjacent beams in the same amount of time that the beams 13 are deflected through 70 vertical pixel positions. Thus for the first 70 vertical locations the barrel shifter 67 will transfer data from storage locations in the skewing buffer 65-1 corresponding to the addresses $b_{13-1}$ through $b_{13-16}$. Beginning at vertical location 71, and for the next seventy locations (through location 140) the shifter 67 will obtain information from the locations $b_{13-2}$ through $b_{13-16}$ of the skewing buffer 65-1 and also from the memory location $b_{13-1}$ of the skewing buffer 65-2.

For different target 11 travel rates, correspondingly different sets of locations would be selected by the shifter 67 to obtain data for the skew-corrected bit maps in the stroke buffer 68. Similarly, during alternate scans the direction of "shifting" or accessing of information from the skewing buffer 65 by the barrel shifter 67 may be reversed from that shown in FIG. 7 to obtain the skew-corrected bit maps.

The Preprocessor

The preprocessor 30 is a software oriented system that translates image data from the format of an input tape to a format that the real time processor 31 can utilize to produce a series of bit maps at a rate that is approximately equal to the rate that the pattern generator 10 is scanning the target 11. The preprocessor produces a series of turn-on and turn-off vectors that are pre-sorted. Although FIG. 1 shows the conversion and sorting processes as separate blocks 33 and 36, these operations are interrelated.

There are four phases of the preprocessor operation, with intermediate data being stored on peripheral devices between flow chart for the preprocessor 30 is phases. The system level shown in FIG. 8. In phase 1, the input tape is read and translated (block 70) from the user's format into the coordinate format which is used by the real time processor 31. Each quadrilateral is clipped (block 71) at the edges of each swath boundary. Each resulting clipped edge is transformed into a vector which does not cross swath boundaries. The output of the first phase is sorted (block 72) into band files, where each band file contains all of the vectors in sixteen adjacent swaths. As many as thirty two band files typically may be used.

After completion of phase I, each band file is sorted separately in the remaining three phases of the preprocessor operation. In phase II, all of the clipped vectors in each band file are sorted (block 73) by swath.

In phase III, which can begin as soon as all of the vectors in the first band file have been completely sorted into their respective swath files, the preprocessor sorts (block 74) the vectors in each swath into one of 128 section files for each swath. This sorting is done according to the x-axis values of their left end points. The ultimate goal is a single file for all the vectors in one swath sorted according to their leftmost end point. The third phase also determines which vectors are turn-on and which are turn-off type.

The third phase has one other task, which occurs only in alternate swaths. As mentioned above, the direction of scanning of the pattern generator 10 alternates between swaths. In order to simplify the real time processor 31, writing is always imagined as proceeding from left to right even though in alternate swaths the writing proceeds from right to left (as shown by the arrow 20 in FIG. 2). To accomplish this, the x-coordinates are reversed for alternate swaths.

In phase IV, the vectors in each section file are sorted (block 75) according to their leftmost end point, and then the section files are combined into sorted swath files with the data coded and packed for use by the real time processor 31.

Phase I

The image input data is provided in the user's format on a computer tape. It first must be converted into the (x,y) coordinate system used by the present data handling system. As the input tape is read, the input data is translated by an algorithm which will vary depending upon the user's format.

Figure 9:
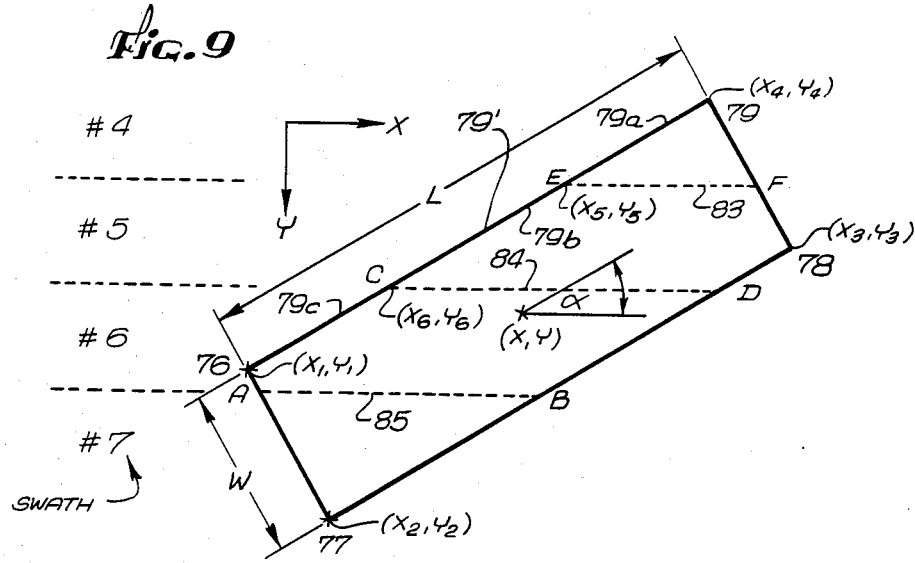
FIG. 9 is a pictorial representation of the image data input format utilized by the preprocessor.

To obtain the vectors, a list is made of each edge of each quadrilateral, as described by its end points or vertices. Referring to FIG. 9, to minimize the amount of data that must be stored, only the four end points 76, 77, 78 and 79 of each polygon need be stored. The leftmost point 76 (smallest x-axis coordinate) is stored first and the remaining points are stored in a counterclockwise direction.

FIG. 4 shows how the user format in which each rectangle is represented on the input tape by the length L, the width W, the orientation given by an angle $\alpha$ and a center position x, y. The translation program (block 70, FIG. 8) first changes user format data into a rectangular coordinate (x, y) set for each of the edge vertices. For example, the values $(x_1, y_1)$, $(x_2, y_2)$, $(x_3, y_3)$ and $(x_4, y_4)$ are established for each rectangle (FIG. 9).

Figure 10:
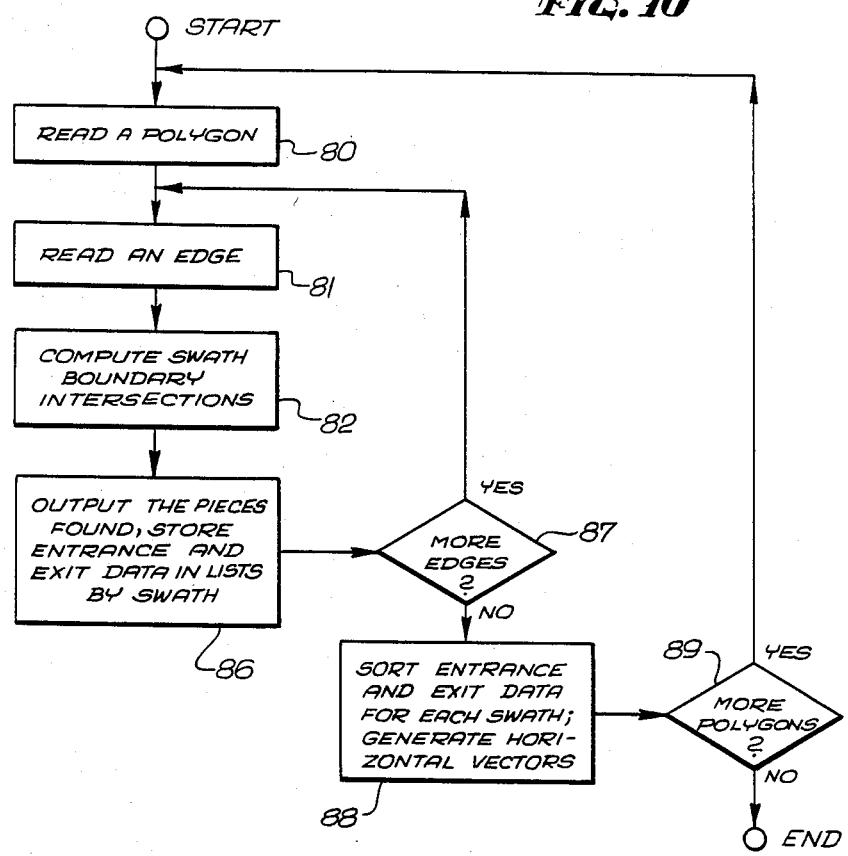

The clipping process (block 71) is detailed in FIG. 10. This routine reads a quadrilateral from intermediate storage (block 80), reads a first edge (block 81) of the quadrilateral, and computes all the intersections of that edge with the swath boundaries (block 82). The pieces of each edge that lie within a swath are stored immediately in the appropriate band file. For example (FIG. 9), the edge 79' crosses two of the three swath boundaries 83, 84, and 85 at coordinates $(x_5, y_5)$ and $(x_6, y_6)$ respectively. Thus the portion 79a of the edge 79' between the vertex 79 and the swath boundary 83, having end coordinates $(x_4, y_4)$, $(x_5, y_5)$ is stored (block 86) in a list associated with swath #4. As described below, the edge 79' is an entrance edge, so that the coordinate $(x_5, y_5)$ is identified as an entrance edge for a swath #5.

As discussed above in connection with FIG. 4, an artificial vector (e.g., the vector 35) must be generated along a swath boundary to provide a turn-on edge.

These artificial vectors are created from the stored list (block 86) of entrance and exit edges. The edge piece storage process is repeated (block 87) for all edges of the quadrilateral. Thereafter, these are sorted and the horizontal artificial vectors are generated (block 88) from the edge piece lists for the upper swath boundaries. These steps are then repeated (block 89) until there are no more quadrilaterals.

FIGS. 11 and 12 show details of the clipping process for an individual edge. The clipping routine starts by getting the two vertices of an edge (block 90) such as the vertices $(x_1, y_1)$ and $(x_2, y_2)$ of the edge $76'$ of FIG. 9. The swath $N_1$ where the edge starts and the swath $N_2$ where the edge finishes is determined (block 92). This calculation is done by comparing each vertex's y coordinate with the range of y coordinates for each swath. For example, the edge $76'$ begins in swath $N_1 = \#6$ and ends in swath $N_2 = \#7$.

If the vector is only in one swath (block 94), then it need not be clipped and may be placed directly in the output list (block 96). Otherwise, the edge must be clipped at each point where it crosses a swath boundary. The first pair of coordinates $(x_1, y_1)$, $(x_2, y_2)$ from the quadrilateral shown in FIG. 9 are used to demonstrate how an edge is clipped. (In this process, for each edge, the end vertex is located counterclockwise about the rectangle with respect to the start vertex. In blocks 98–100, the start has coordinate $Y_1$ and the end has coordinate $Y_2$, with the y-axis values increasing toward the bottom of FIG. 9.) The coordinates $Y_1$ and $Y_2$ are compared (block 98). In this example, $Y_2$ is greater than $Y_1$, so the edge is designated (block 100) as an entrance edge (E=1). This means that all of the intersections of the edge with a swath boundary will be assigned to an entrance list for generating the artificial vectors. If $Y_1$ were greater than $Y_2$, the edge would be designated (block 102) an exit edge (E=0). The assignments of $X_u$, $Y_u$ and $X_L$, $Y_L$ are made (as indicated in blocks 100 and 102), the slope is calculated (block 104), and the x-direction displacement per swath is calculated by multiplying the slope by 1024. This quantity S is the change in x of an edge in a swath.

Referring now to FIG. 12, a swath counter N is incremented (block 110) and the intersection of the edge with the first swath boundary is calculated (block 112). Next, the intersection of the edge with the next swath boundary is calculated (block 114) and the vector for the swath is written into a vector list (block 116). This vector has an x-axis start coordinate $x_s$, a y-axis start coordinate $y_s$, an x-axis end coordinate $x_e$, and a slope. The x-axis start and end coordinates $x_s$ and $x_e$ are stored in the exit or entrance list for this swath (block 118) depending upon the designation of the edge as an entrance or exit edge.

If the last swath has been reached (block 120), then the remaining vector, representing the remainder of the edge, is provided to the vector list (block 122). Otherwise, the swath count N is incremented (block 124), the next swath intersection is computed (block 126), and the process is reiterated to clip the remainder of the edge. After the first edge of a quadrilateral has been clipped, the other edges of the quadrilateral must be clipped into vectors in the same manner.

After all of the edges of each quadrilateral have been clipped, the artificial vectors across the top of each swath must be generated by use of the entrance and exit lists. The entrance list and exit list for each swath is taken from memory separately for each swath that the quadrilateral intersects. An artificial vector is generated connecting the closest point of entry at a swath boundary to the closest point of exit at that same boundary of the swath. Referring now to FIG. 9, where the dotted lines represent swath boundaries, turn-on vectors must be generated at the top swath boundaries 83, 84, 85. Therefore, when the entry and exit lists are combined, intersections A and B will be connected by one artificial vector, C and D will be connected by another vector and E and F will be connected a third vector.

The resultant vectors are placed in one of 32 band files on the basis of their y-axis coordinate values. Vector from sixteen consecutive swaths are assigned to the same band file, and the next sixteen swaths belonging to the next band, etc. When all of the edges have been clipped and placed in the swath files, phase II may be begin.

Phases II and III

Phase II (block 73, FIG. 8) of the preprocessor 39 operation is part of the sorting process. Since there are too many swaths to sort vectors directly into their appropriate swath files, in phase I the vectors are sorted into one of 32 band files of sixteen consecutive swaths each. In phase II each of the band files is read and the vectors are distributed into the appropriate swaths solely by the y-axis start address $y_s$.

Once all of the vectors in a band file have been sorted into their swaths, phase III (block 74) may be started while phase II is continued for the other band files. Within each swath, the vectors must be sorted by their smallest $x_s$ coordinate (leftmost coordinate). The x-coordinates for all vectors in every other swath must be reversed to take into account the reciprocating generation of the pattern. Finally each vector must be assigned a turn-on or turn-off direction value to be used for forming the bit map.

FIG. 13 shows the steps of phase III. In each even numbered swath, the x-coordinates must be reversed (block 140). The technique used is to replace each value of x by $x_0 + x_1 - x$, where $x_0$ and $x_1$ are the coordinates of the left and right margin of the block. After reversal, the criterion for setting the direction (turn-on or turn-off) D in even swaths is opposite to that in odd number swaths. If the x start coordinate $x_s$ is less than the x-axis end coordinate $x_e$ for the vector (block 142), then the direction D for even numbered swaths will be −1 and for odd numbered swaths, D will be +1 (block 144). If $x_s$ is greater than $x_e$ (block 142), then $x_e$ will become $x_s$ and $x_s$ will become $x_e$ (block 145). The corresponding y-axis coordinates are also exchanged. The direction D of the vector will be +1 for an even numbered swath and −1 for an odd numbered swath.

In the third phase, the vectors are also sorted (block 148) into one of the 128 section files according to the range of the start address $x_s$. All vectors that start within a given x range in each swath are stored in that section file for further sorting. This phase will be repeated (block 149) until there are no more vectors to be sorted.

Thus, by the end of phase III, all of the vectors are assigned a turn-on/turn-off direction and have been partially sorted in the x-direction to allow for efficient generation of the image by the pattern generator 10.

Phase IV

The last phase of preprocessing produces swaths containing vectors in a coded format that may be directly usable by the real time processor. The vectors in each section file are sorted according to the leftmost $x_s$ coordinate for even number swaths and by rightmost $x_s$ coordinate for odd number swaths. When this sorting is complete the list is read in order, each vector is coded and packed and is written onto the disk in the order by which the vectors have been sorted for use by the real time processor.

I claim:

1. For use with a laser or other pattern generator in which plural beams are swept across successive blocks of a target to form an image, a data handling system comprising:
   preprocessor means for providing a set of vectors defining edges of polygons to be included in the image formed in said successive blocks,
   a bit map precursor memory having a set of storage locations corresponding to each of said beams,
   a pipeline comprising plural beam processors each associated with a respective beam and arranged in series to successively process vectors from said preprocessor means, each beam processor having means for determining if the processed vector defines an edge which is intersected by the beam to which that beam processor is associated, and if so, for entering into said precursor memory, at a storage location corresponding to such intersection, a beam on/off direction control signal established by said vector, and
   means for modulating said plural beams, as they are swept, with information derived from the resultant contents of said bit map precursor memory.

2. A system according to claim 1 wherein each of said vectors includes start coordinates initially identifying one end of the edge defined by said vector with respect to a y-axis extending in the direction of sweep of said beams and a y-axis substantially transverse thereto, an end coordinate identifying the other end of said defined edge with respect to said y-axis, a slope, and a beam on/off direction control signal.

3. A data handling system according to claim 2 wherein in said pipeline, each of said beam processors, after determination has been made by said means for determining, modifies the start coordinates of said processed vector by changing a x-axis start coordinate value by an amount equal to the effective x-axis spacing between adjacent beams, and modifies the y-axis start coordinate value by an amount determined by said slope, the resultant modified vector being passed along to the the next successive beam processor in said pipeline for like processing thereby.

4. A data handling system according to claim 3 further comprising:
   controller means for assembling a set of said vectors provided by said preprocessor means, said set of vectors, when processed by said pipeline, establishing in said bit map precursor memory a complete assemblage of data for a single block, and wherein:
   the final beam processor in said pipeline supplies the resultant modified vector back to said controller means for inclusion thereby in the set of vectors assembled for the next, successive block, in the event said fedback modified vector still represents a portion of an edge.

5. A data handling system according to claim 2 wherein said beam on/off direction control signal has a positive numerical value for one on/off direction and a negative numerical value for the other on/off direction, the numerical value of the processed vector being algebraically combined with the prior contents of the corresponding storage location in said bit map precursor memory by said processor, the net resultant contents of each storage location in said precursor memory representing whether the corresponding beam should be on or off at a deflection angle associated with that storage location.

6. A data handling system according to claim 1 and used in a pattern generator wherein during pattern generation said target is moved transversely with respect to the direction of sweep of said beams so that each of said successive blocks is skewed, said system further comprising:
   skew compensator means, cooperating with said bit map precursor memory, for providing said information for modulation of said beams by selectively reading out skewed portions of the contents of said bit map precursor memory established for adjacent successive blocks.

7. A data handling system according to claim 6 wherein said bit map precursor memory has two like sets of storage locations, said pipeline entering beam on/off direction control signals into one of said sets when processing the vectors associated with one block, and entering such signals into the other of said sets when processing vectors for alternate blocks, and wherein:
   said skew compensator means selectively reads out portions of data established in both of said sets of storage locations to provide said information for beam modulation.

8. A data handling system according to claim 7 wherein the sets of said storage locations which are read out by said skew compensator means are offset by a number of x-axis beam width dimensions per certain number of y-axis sweep deflection angle values, said certain number depending on the rate at which said target is moved.

9. A data handling system for use with a laser or other pattern generator in which plural beams are swept across successive blocks of a target to form an image, said image comprising a plurality of polygons defined by certain input data provided to said system, comprising:
   preprocessor means (a) for converting said polygon defining input data into a vector format in which each vector represents a portion of an edge of a polygon lying entirely within a swath defined by plural adjacent successive blocks of said target, each such vector including an initial start location of said edge portion, and end location of said edge portion, and a beam on/off direction control data, and (b) for sorting said vectors in accordance with the initial start locations thereof,
   real time processor means, receiving said sorted vectors and including a bit map precursor memory having a storage location for each image element position in the sweep direction for each of said plural beams, for generating a bit map precursor in said memory in response to said vectors, the contents of each memory storage location thereby comprising a numeric value established by an algebraic combination of beam on/off direction control data for all vectors relating to edges crossing image positions associated with that storage location, and
   bit map generation means for deriving from the contents of said bit map precursor memory a bit map of beam turn-on and turn-off control instructions for controlling each of said beams during the sweep of each block.

10. For use with a pattern generator having a plurality of beams which are mutually offset along an x-axis and which are repetitively swept along a y-axis across portions of a target as the target is moved in the x-direction, said beams thus sweeping across a swath of successive generally parallelogram-shaped blocks, a system for producing skew compensated bit map data for real time modulation of said beams, comprising:

bit map precursor memory means for establishing, alternately in first and second precursor memories, bit map precursor data comprising, in memory locations corresponding to y-axis positions of said beams, information indicating whether at these positions, the beams should be on or off to produce a resultant image, a set of buffers into which the bit map precursor data is supplied from said first and second precursor memories for two adjacent non-skew corrected block portions of said image, barrel shifter means for reading out data from skewed portions of said buffers which contain bit map precursor data for adjacent non-skew corrected block portions, and modulation means for modulating said beams with said read out data during an actual sweep of said beams across said target.

11. A data preprocessor system for modifying input image data representing an assemblage of polygons into a vector format usable in real time by a laser or other pattern generator in which plural beams are swept across successive blocks of a target to form said image, said system comprising:

first means for converting said input polygon image data into a set of preliminary vectors each representing an edge of said polygon and each having respective initial and terminal ends, and ordered in a clockwise or counterclockwise direction around the periphery of said polygon, and for defining each of said vectors as an "entrance" or "exit" vector in accordance with relative y-axis values of the initial and terminal ends of said preliminary vectors in said ordered direction, second means for converting said preliminary vectors to final vectors associated with sections of said edges falling within each of a series of swaths that are produced by said pattern generator on a target, means for sorting said final vectors within each such swath in accordance with x-axis end point values thereof, and means for utilizing said sorted final vectors to produce modulation control signals for said swept beams.

12. A preprocessor system according to claim 11 wherein said utilizing means comprises:

bit map conversion means for processing plural final vectors for entering a +1 or −1 into a precursor memory in accordance with whether the processed vector is an "entrance" vector or an "exit" vector respectively, thereby producing a bit map precursor representation of an image to be produced as said beams are swept across said target.

13. A preprocessor system according to claim 11 further comprising:

artificial vector generation means for generating "artifical" vectors defining edge segments along a swath boundary, each of said "artifical" vectors beginning at an entrance vector and ending at a exit vector in said sorted set.

14. A preprocessor system according to claim 11 further comprising:

means for inverting the x-axis coordinates of all of said vectors for alternate swaths to compensate for alternate travel direction of said target during pattern generation of said alternate swaths.

15. For use with a pattern generator in which plural beams are repetitively swept in the x-axis direction across a target as the target is moved in the y-axis direction, thereby to form a swath portion of an image, a real time processor adapted to utilize image data in the form of vectors representing edges of polygons lying within said swath, said vectors being sorted in accordance with an endmost x-axis coordinate value thereof, comprising:

a pipeline having a plurality of beam processors connected in series and each associated with a respective one of said plural beams, there being a point buffer associated with each of said beam processors, said vectors being supplied in said sorted order to the first of said series of beam processors, each of said beam processors including:

means for ascertaining from said vector whether the beam with which said processor is associated intersects the edge corresponding to that vector during a deflection of said beam, and means, operative if said beam is intersected, for entering into said point buffer an indication of whether said beam should be turned on or turned off when crossing said edge intersection, and nibbling means for modifying said vector to change said endmost x-axis coordinate value thereof by an amount corresponding to the x-axis separation between adjacent beams, and for commensurately modifying the y-axis end coordinate value in accordance with the slope of the edge represented by said vector, the resultant nibbled vector being passed along said pipeline to the next of said beam processors.

16. A data translator for forming a bit map from input data, wherein said input data is a plurality of quadrilaterals having edges, said data translator comprising;

preprocessing means for clipping the edges of quadrilatrals in a first direction, and translating the edges into a series of sorted turn-on/turn-off vectors; and real time processing means for processing said series of turn-on/turn-off vectors and translating said vectors into a bit map precursor, said processing means comprising;

a bit map precursor pixel memory having a set of storage locations corresponding to at least a portion of an image to be defined by said plurality of quadrilaterals, and means for entering bits into said precursor memory in a column-by-column order in one direction by entering bits of a first value before the turn-on vector location is reached, entering bits of a different value after the turn-on vector location is reached and continuing until the next turn-off vector location is reached, and thereafter entering bits of said first value, said means for entering operating repeatedly with respect to the same set of storage locations for each of said plurality of quadrilaterals having edges represented by turn-on/turn-off vectors located within the same portion of an image, thereby to produce a bit map precursor having pixel bit values established by said turn-on and turn-off vectors for all of said plurality of quadrilaterals having edges falling within said same portion of an image.

17. A data translator for forming a bit map for modulating a plurality of beams, wherein said input data is a plurality of quadrilaterals having edges, said data translator comprising:

preprocessing means for clipping the edges of quadrilaterals in a first direction, and translating the edges into a series of sorted turn-on/turn-off vectors;

real time processing means for processing said series of turn-on/turn-off vectors and translating said vectors into a bit map; and wherein said real time processing means includes:

a data buffer for storing a pre-determined number of turn-on/turn-off vectors;

a beam-processor pipeline accessing data from the data buffer, said pipeline comprising a plurality of beam-processors connected in series, each processor outputtting data;

a first and a second point buffer for each beam processor, wherein the output data of each beam processor is alternatively stored in either the first or second point buffer;

at least three skewing buffers;

a skewing buffer controller, wherein said skewing buffer controller converts the output data of all of the beam-processors into a bit map, said bit map being stored in at least one skewing buffer; and means for providing the data of each skewing buffer for modification of the beams.

18. A data translator as decribed in claim 17, wherein said skewing buffer controller further includes means for skewing said bit map.

19. A data translator as described in claim 18, such that each turn-on and turn-off vector has a y start and a x start coordinate, an x end coordinate and a slope, wherein each beam-processor has two point buffers and a temporary x coordinate and performs the following steps:

(a) takes a first vector available as its input and determines whether the x coordinate of the beam processor is the range of the x start and x end coordinates the path of the beam of said beam-processor and if the vector;

(b) passes the vector to the next beam-processor in the pipeline if said vector does not cross said path and jumps to step (g);

(c) if the vector is a turn-on vector, add a one to the byte in the first point buffer with an address equal to the y start coordinate of the vector;

(d) if said vector in step (b) is a turn-off vector, subtracts a one from the address of the first point buffer equal to the y start coordinate in said first point buffer;

(e) sets the x start coordinate of the vector equal to the x start coordinate plus one;

(f) sets the y start coordinate of the vector equal to the y start coordinate plus the inverse of the slope and pass the vector to the next beam processor in the pipeline;

(g) gets the next vector available, and repeat steps (b) through (f) until a predetermined number of vectors have been processed;

(h) repeats steps (a) through (g) except that the second point buffer for each beam processor is used instead of the first point buffer; and (i) repeats steps (a) through (h) until there are no more vectors left.

20. A data translator as described in claim 19, such that each point buffer has a plurality of bytes of memory, wherein the skewing buffer controller has a plurality of accumulator registers and the skewing buffer controller performs the following steps:

(a) take a first byte of data from each first point buffer and stores each byte in a register assigned to the first point buffer;

(b) compares the contents of each register with zero and if said contents of the register are greater than zero, loads a one in the appropriate bit of one of the skewing buffers, otherwise loads a zero in said appropriate byte of the skewing buffer;

(c) clears each byte in each point buffer where the data was taken from;

(d) gets the next byte from each point buffer and adds the byte to the contents of the register that the first byte from the same register was stored in and stores said sum in the same register;

(e) repeat steps (b) through (d) until all of the bytes in the first point buffers have been cleared;

(f) repeat steps (a) through (e) except the second point buffers are used;

(g) repeat steps (a) through (f) alternately using the first and second point buffers until there is no more data to process.

21. A data translator for forming a bit map from input data, wherein said input data is a plurality of quadrilaterals having edges, said data translator comprising:

preprocessing means for clipping the edges of quadrilaterals in a first direction, and translating the edges into a series of sorted turn-on/turn-off vectors;

real time processing means for processing said series of turn-on/turn-off vectors and translating said vectors into a bit map such that said data translator takes the input data comprising a plurality of quadrilaterals and transforms said data into a bit map for each block that is to be painted by a pattern generator and the pattern generator paints a substrate in alternate directions for alternate swathes, wherein said preprocessing means include:

means for transforming said list of quadrilaterals into a list of vectors having two ends, wherein each vector remains within one swath;

means for sorting vectors according to swaths; and means for deciding which vectors are turn-on vectors and which are turn-off vectors.

22. A data translator as described in claim 21, wherein said means for transforming said list of quadrilaterals into a list of vectors includes the following steps:

(a) selecting a first edge of a first quadrilateral and clipping said first edge into a separate vector for each swath said edge crosses;

(b) recording the intersection of said first edge with each boundary between swathes;

(c) repeating steps (a) and (b) for the remaining edges of said first quadrilateral in a counterclockwise manner around the quadrilateral;

(d) closing off the upper boundary of each swath by connecting the intersection of the first edge with each swath boundary with the nearest point of intersection of another edge with said swath boundary, forming a vector at each swath boundary;

(e) if any other points of intersection between the edges remain after step (d) connecting the remaining points of intersection at each swath boundary forming additional vectors; and (f) repeat steps (a) through (e) for all of the quadrilaterals.

23. A data translator as described in claim 22, using an (x,y) coordinate system, each vector first end having an x start and a y start coordinate and a second end having an x end and y end coordinate, wherein said means for deciding which vector is a turn-on vector and which vector is a turn-off vector is done after the vectors are sorted according to swathes and wherein said means for deciding includes the following steps:

(a) determining whether the value of the x start coordinate of the vector is greater than the value of the x end coordinate of the vector; and (b) if the value of the x start coordinate is greater than the value of the x end coordinate, then the first end becomes the second end and the second end becomes the first end, and furthermore the vector is a turn-on vector if it is in an even numbered swath and a turn-off vector if it is in an odd numbered swath; and (c) if the value of the x start coordinate is less than the value of x end coordinate then the vector is a turn-off vector and furthermore the vector is a turn-on vector if it is in an even numbered swath and it is a turn-off vector if said vector is in an odd numbered swath.

24. A data translator for forming a bit map from input data, wherein said input data represents a plurality of quadrilaterals forming a pattern to be produced strip-by-strip by a pattern generator, said data translator comprising:

processor clipping means for segmenting a data representation of edges of said quadrilaterals into clipped edge vector segments each representing a clipped portion of said edge within a respective strip of pattern to be generated, and for assigning a turn-on/turn-off characteristic to each such vector segment depending on the relative end positions of the represented clipped edge portion, and bit map processing means for forming, from the clipped edge vector segments, a bit map representation of the portion of each quadrilateral within each strip, with the bit map value at each pixel posiiton being established with respect to the turn-on/turn-off characteristic of the vector segments and the relative location of said pixel position within said strip with respect to the edge segment represented by said clipped edge vector segment.

* * * * *

UNITED STATES PATENT AND TRADEMARK OFFICE
CERTIFICATE OF CORRECTION

PATENT NO. : 4,620,288

DATED : October 28, 1986

INVENTOR(S) : Thomas E. Welmers

It is certified that error appears in the above-identified patent and that said Letters Patent is hereby corrected as shown below:

In the Drawings:

Figure 1, Box 36, "SWATCHES" should read --SWATHS--.

Figure 5, Box 55, "LOCATION" should read --LOCATIONS $Y_s$ to 1024 (where $Y_s$ is the present Y axis start address)--.

Column 3, line 14, "Buffer 27" should read --Buffer 22--.

Column 10, line 39, "location 800" should read --locations 800 to 1024--.

Column 10, line 42, "location 800" should read --locations 800 to 1024--.

Column 12, line 64, "Buffer 27" should read --Buffer 22--.

Column 13, line 4, "Buffer 27" should read --Buffer 22--.

Claim 2, Column 17, line 37, "y-axis" should read --x-access--.

Claim 2, Column 17, line 39, "y-axis" should read --x-access--.

Signed and Sealed this

Twenty-fourth Day of March, 1987

*Attest:*

DONALD J. QUIGG

*Attesting Officer*    *Commissioner of Patents and Trademarks*